Aug. 29, 1967 R. O. GRAY 3,337,950

METHOD OF ASSEMBLING A TELEVISION CHASSIS

Filed Jan. 18, 1965

INVENTOR.
Richard O. Gray
BY
Cornelius J. O'Connor
Atty.

3,337,950
METHOD OF ASSEMBLING A TELEVISION CHASSIS

Richard O. Gray, Broadview, Ill., assignor to Zenith Radio Corporation, Chicago, Ill., a corporation of Delaware Filed Jan. 18, 1965, Ser. No. 426,147
2 Claims. (Cl. 29—624)

ABSTRACT OF THE DISCLOSURE

A method of assembling a television chassis having an electrical circuit which includes terminal bearing fixed components such as terminal strips and tube sockets and circuit components such as resistors, capacitors, etc. The method entails the steps of initially providing a chassis blank having a main section which includes an incomplete downturned flange that serves as a support wall for the chassis and an auxiliary section which is integrally joined to the main section by common tabs. The fixed components are mounted on the main and auxiliary sections of the chassis and then the circuit components are wired between the terminals of the fixed components to complete the electrical circuit. Thereafter the auxiliary section is bent to a position in alignment with the flange of the main chassis to form a complete chassis assembly.

This invention relates in general to electronic apparatus manufacturing techniques and in particular to a method of assembling a wired television chassis.

In the consumer electronics industry considerable effort has been expended to reduce the weight and bulk of entertainment apparatus such as radios, tape recorders and, most recently, television receivers, in order to render them more portable. In this regard advances in the component art have resulted in improved devices which also are physically reduced in size thus significantly contributing to portability. Printed circuits have been widely used to provide greater compactness, but wired chassis are preferred for reliability and ease of servicing in many applications.

It is a principal object of the invention to provide an improved method of assembling a wired chassis for a television receiver or the like.

It is a more particular object of the invention to provide a novel method of assembling a wired electronic chassis to permit achievement of a reduced overall size.

It is a further object of the invention to provide a method of assembling a wired television chassis which effects a substantial economy in labor costs.

In accordance with the invention there is provided a method of assembling a television chassis or the like having an electrical circuit comprising a plurality of fixed components such as terminal strips, tube sockets, potentiometers and the like providing connection terminals at fixed locations on the chassis base with additional circuit components such as resistors, capacitors, inductors and wire connectors wired between the connection terminals. The inventive method provides a chassis assembly of reduced overall size for supporting the circuit and comprises the following steps. First there is provided a chassis blank having a main section, a circumferentially incomplete downturned flange constituting a portion of the supporting wall for the main section of the chassis, and an auxiliary section adjoining the main section and co-planar therewith at a gap in the flange. The auxiliary section has a width corresponding to the height of the flange and is connected to the main section by deformable tabs which are integral with the main section. Both the main section and the auxiliary section have provisions, including cutouts, for receiving the fixed components in a predetermined circuit layout. The fixed components are mounted to the component receiving provisions in the main section and the auxiliary section of the chassis blank in order to anchor the connection terminals in a fixed relation to the chassis blank. The electrical circuit is then completed by wiring the additional circuit components between the fixed connection terminals. Thereafter, the deformable tabs are bent to bring the auxiliary section, with its circuit components wired into the electrical circuit, into substantial alignment with the downturned flange thereby completing the chassis assembly.

The features of this invention which are believed to be novel are set forth with particularity in the appended claims. The invention, together with further objects and advantages thereof, may best be understood, however, by reference to the following description taken in conjunction with the accompanying drawing, in the several figures of which like referenced numerals identify like elements, and in which:

Figures 1, 2, 4:
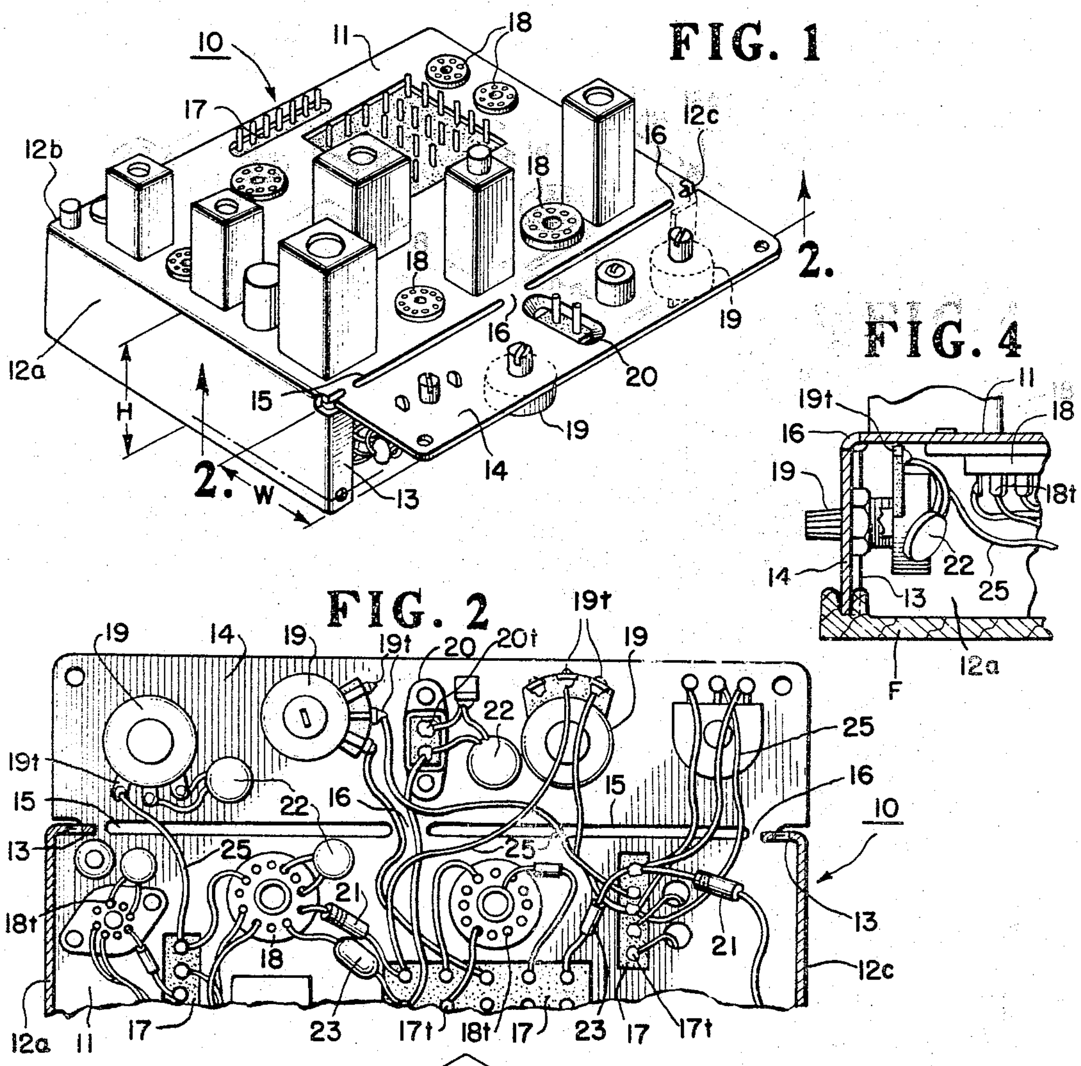
FIGURE 1 is a perspective view of a partially assembled television chassis constructed in accordance with the invention.
FIGURE 2 is an underside view of a portion of the television chassis shown in FIGURE 1.
FIGURE 4 is a sectional view of a television chassis taken along lines 4—4 of FIGURE 3.

The apparatus 10 shown in FIGURE 1 is a chassis assembly for a television receiver and it comprises a main section 11 which is bounded by a circumferentially incomplete downturned flange. The flange is constituted of portions 12*a*, 12*b* and 12*c* which form supporting walls for main section 11. Each of walls 12*a*, 12*c* is terminated by an offset lip 13 for a purpose to be described. An auxiliary chassis section 14 adjoins main section 11 along a mutual boundary area which is mutilated as by the provision of a series of slots 15 to provide a fold-line. Auxiliary chassis section 14 has a width W corresponding to the height H of the flange comprising wall portions 12*a*–12*c*, and it is connected to main chassis section 11 by deformable tabs 16 which extend between slots 15 and are integral with the main section. Initially, chassis section 14 is co-planar with the main section in the vicinity of the gap in the flange between side walls 12*a* and 12*c*, as shown in FIGURES 1 and 2. Both the main and the auxiliary sections of the chassis have provisions including cutouts which can assume any of a variety of configurations for receiving a series of fixed components in a predetermined circuit layout.

More particularly, the fixed components employed in chassis 10 comprise a plurality of terminal strips 17, tube sockets 18, potentiometers 19 and the like. These components provide respective connection terminals 17*t*, 18*t* and 19*t* at various fixed locations on both the main and auxiliary chassis sections. In order to achieve optimum chassis compactness and as best seen in FIGURE 2, the fixed components disposed on opposite sides of the fold-line between the main and auxiliary chassis sections are preferably arranged in a staggered array, although such staggering is not essential to realization of the benefits of the invention in many applications. Auxiliary section 14 further accommodates an AC interlock plug 20 having terminal connectors **20*t***.

Chassis assembly 10 further includes additional circuit components such as resistors 21, capacitors 22, and inductors 23 which are wired between selected ones of the connection terminals to complete the desired electrical circuit. Flexible connectors such as stranded wire conductors 25 are employed where it is desired to effect an electrical connection between circuit components on main chassis 11 and those on auxiliary section 14.

The assembly process entailed in constructing television chassis 10 initially contemplates the forming of a chassis blank having main section 11, flange portions **12*a*–12*c* and auxiliary section 14 from a sheet of flat stock as by a stamping operation. Desirably the various cutouts for receiving the fixed circuit components, as well as the fold-line slots 15, are formed during the aforesaid stamping operation. Portions 12*a*, 12*b* and 12*c* are then folded down to form a circumferentially incomplete flange constituting a supporting wall for main section 11 of the chassis. Wall portion 12*b* is then secured to walls 12*a* and 12*c* as by spot welding to offset lips (not shown) such as lips 13 provided at the front ends of walls 12*a* and 12*c***.

Next, terminal strips 17, tube sockets 18 and the potentiometers 19 are mounted in their respective cutouts and anchored therein by riveting or other suitable means. At this stage the chassis constitutes a plurality of components presenting connection terminals **17*t*, 18*t* and 19*t*** at fixed locations thereon.

Resistors 21, capacitors 22, inductors 23, and wire leads 25 are then wired between assigned ones of connection terminals **17*t*, 18*t* and 19*t*** to establish a predetermined electrical circuit.

Figure 3:
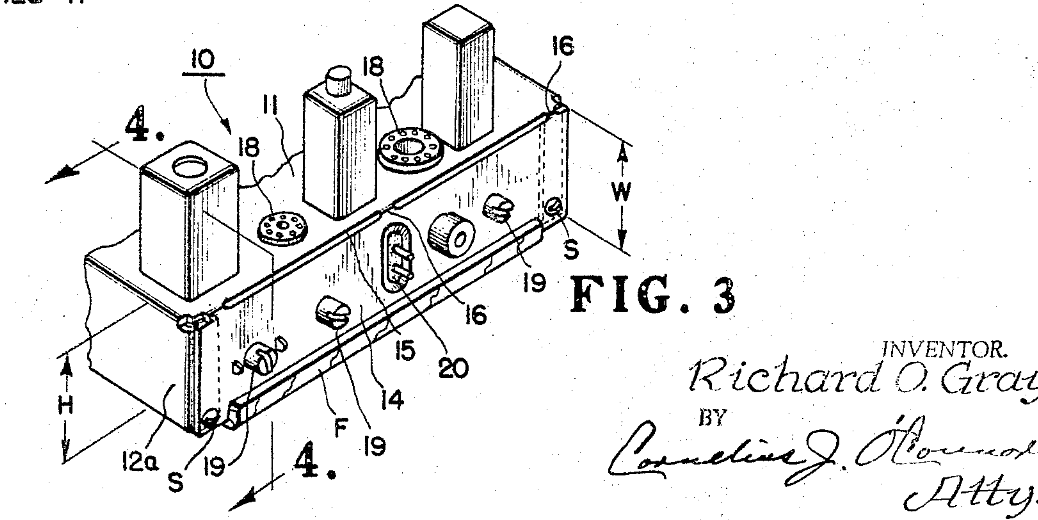
FIGURE 3 is a fragmentary perspective view of a substantially completed television chassis assembly.

Finally, the chassis assembly is completed by bringing the auxiliary section 14 into alignment with the walled flange of the chassis. This is most easily achieved by inserting the main section, or the auxiliary section as shown in FIGURE 3, in a fixture F and bending the main section about tabs 16 until the offset lips 13 of walls **12*a* and 12*c* contact the ends of the auxiliary chassis section. The use of flexible wire conductors 25 to connect the components on auxiliary chassis section 14 to those on the main section 11 permits this bending operation to be effected without disrupting the electrical circuit connections. By staggering the fixed components on the main and auxiliary chassis sections as described above, it is often possible to achieve still greater compactness of the completed chassis; in any event, such staggering provides interleaving of the components when section 14 is bent into alignment with wall sections 12*a*–12*c* and prevent undesired mechanical or electrical fouling of components on one of chassis sections 11 and 14 with those on the other. Auxiliary chassis section 14 is then anchored in this position by securing its ends to lips 13** by screws S or other fastening means.

As disclosed, the described method achieves a television chassis assembly of reduced overall size by resort to an "open" chassis construction, that is, delaying the final mechanical assembly step until the chassis is completely wired. Since this construction affords the operator ample room in which to manipulate his pliers, soldering iron, etc., the spacing between circuit components can be reduced to an extent not realizable by conventional assembly methods. Furthermore, in addition to achieving compactness, the inventive method effects a significant saving in assembly labor costs by virtue of the fact that the circuit components and their connection terminals are rendered more accessible to the operator. Finally, while the inventive method has been addressed to a television chassis, it is appreciated that the disclosed process is applicable with like advantages to electrical chassis assemblies such as are employed in radios, tape recorders, etc.

While a particular embodiment of the present invention has been shown and described, it is apparent that changes and modifications may be made therein without departing from the invention in its broader aspects. The aim of the appended claims, therefore, is to cover all such changes and modifications as fall within the true spirit and scope of the invention.

I claim:

1. A method of assembling a television chassis or the like having an electrical circuit comprising a plurality of fixed components such as terminal strips, tube sockets, potentiometers and the like providing connection terminals at fixed locations on a chassis base with additional circuit components such as resistors, capacitors, inductors and wire connectors wired between said connection terminals, which method provides a chassis assembly of reduced overall size for supporting said circuit and comprises the following steps:

providing a chassis blank having a main section, a circumferentially incomplete downturned flange constituting a portion of the supporting wall for said main section of said chassis and an auxiliary section adjoining said main section and co-planar therewith at a gap in said flange, said auxiliary section having a width corresponding to the height of said flange and being connected to said main section by deformable tab means integral therewith, and both said main section and said auxiliary section having provisions, including cutouts, for receiving said fixed components in a predetermined circuit layout;

mounting said fixed components to said component receiving provisions in said main section and said auxiliary section of said chassis blank to anchor said connection terminals in fixed relation to said chassis blank;

wiring said additional circuit components between assigned ones of said fixed connection terminals to complete said electrical circuit;

and thereafter bending said deformable tab means to bring said auxiliary section, with its circuit components wired into said electrical circuit, into substantial alignment with said downturned flange.

2. A method of assembling a television chassis or the like having an electrical circuit comprising a plurality of fixed components such as terminal strips, tube sockets, potentiometers and the like providing connection terminals at fixed locations on a chassis base with additional circuit components such as resistors, capacitors, inductors and wire connectors wired between said connection terminals, which method provides a chassis assembly of reduced overall size for supporting said circuit and comprises the following steps:

providing a chassis blank having a main section, a circumferentially incomplete downturned flange constituting a portion of the supporting wall for said main section of said chassis and an auxiliary section adjoining said main section and co-planar therewith at a gap in said flange, said auxiliary section having a width corresponding to the height of said flange and being connected to said main section by deformable tab means integral therewith, and both said main section and said auxiliary section having provisions, including cutouts, for receiving said fixed components in a predetermined circuit layout;

mounting said fixed components to said component receiving provisions in said main section and said auxiliary section of said chassis blank to anchor said connection terminals in fixed relation to said chassis blank;

wiring said additional circuit components between assigned ones of said fixed connection terminals to establish said electrical circuit;

effecting flexible electrical connections between said terminals on said main section of said chassis and said terminals on said auxiliary section;

and thereafter bending said deformable tab means to bring said auxiliary section, with its circuit components wired into said electrical circuit, into substantial alignment with said downturned flange, and securing said auxiliary section to said downturned flange to complete said chassis assembly.

References Cited

UNITED STATES PATENTS

| | | | |
|---|---|---|---|
| 2,185,562 | 2/1940 | Nielson | 325—353 |
| 2,923,859 | 2/1960 | Worth | 29—155.5 X |
| 2,947,811 | 8/1960 | Archer | 178—7.9 |
| 3,223,153 | 12/1965 | Simpelaar. | |

JOHN F. CAMPBELL, *Primary Examiner.*

T. L. CLINE, *Assistant Examiner.*